(12) United States Patent
Loeffler et al.

(10) Patent No.: US 11,180,719 B2
(45) Date of Patent: Nov. 23, 2021

(54) USE OF COMPOSITIONS COMPRISING A SILOXANE-TYPE ADDITIVE FOR AVOIDING PATTERN COLLAPSE WHEN TREATING PATTERNED MATERIALS WITH LINE-SPACE DIMENSIONS OF 50 NM OR BELOW

(71) Applicant: BASF SE, Ludwigshafen am Rhein (DE)

(72) Inventors: Daniel Loeffler, Ludwigshafen (DE); Mei Chin Shen, Taoyuan (TW); Sheng Hsuan Wei, Hillsboro, OR (US); Frank Pirrung, Ludwigshafen (DE); Lothar Engelbrecht, Berlin (DE); Yeni Burk, Ludwigshafen (DE); Andreas Klipp, Ludwigshafen (DE); Marcel Brill, Ludwigshafen (DE); Szilard Csihony, Ludwigshafen (DE)

(73) Assignee: BASF SE, Ludwigshafen am Rhein (DE)

( * ) Notice: Subject to any disclaimer, the term of this patent is extended or adjusted under 35 U.S.C. 154(b) by 17 days.

(21) Appl. No.: 16/756,303

(22) PCT Filed: Oct. 29, 2018

(86) PCT No.: PCT/EP2018/079555
§ 371 (c)(1),
(2) Date: Apr. 15, 2020

(87) PCT Pub. No.: WO2019/086374
PCT Pub. Date: May 9, 2019

(65) Prior Publication Data
US 2020/0255772 A1   Aug. 13, 2020

(30) Foreign Application Priority Data
Nov. 3, 2017   (EP) .................... 17199807

(51) Int. Cl.
  *C11D 3/37*   (2006.01)
  *C11D 7/50*   (2006.01)
  *G03F 7/40*   (2006.01)
  *H01L 21/02*   (2006.01)

(52) U.S. Cl.
CPC .......... *C11D 3/3734* (2013.01); *C11D 3/3738* (2013.01); *C11D 7/5022* (2013.01); *G03F 7/40* (2013.01); *H01L 21/02057* (2013.01)

(58) Field of Classification Search
CPC ............................ C11D 3/373; C11D 11/0047
USPC ....................................................... 510/175
See application file for complete search history.

(56) References Cited

U.S. PATENT DOCUMENTS

| 2008/0299487 | A1  | 12/2008 | Chang |
| 2013/0092191 | A1  | 4/2013  | Saio et al. |
| 2013/0255534 | A1  | 10/2013 | Ryokawa et al. |
| 2015/0318183 | A1  | 11/2015 | Ido et al. |
| 2015/0325458 | A1  | 11/2015 | Printz |
| 2016/0279677 | A1* | 9/2016  | Ball ................. C11D 3/3418 |
| 2017/0062203 | A1  | 3/2017  | Ryokawa et al. |

FOREIGN PATENT DOCUMENTS

| JP | 2013-257379 A    | 12/2013 |
| WO | WO 2012/027667 A2 | 3/2012  |
| WO | WO 2014/091363 A1 | 6/2014  |
| WO | WO 2017/002497 A1 | 1/2017  |

OTHER PUBLICATIONS

International Search Report dated Feb. 1, 2019 in PCT/EP2018/079555 filed on Oct. 29, 2018, citing documents AA-AE, AO and AP therein, 4 pages.
U.S. Appl. No. 16/064,918, filed Jun. 21, 2018, US 2018-0371371 A1, Daeschlein, C., et al.
U.S. Appl. No. 16/064,686, filed Jun. 21, 2018, US 2019-0002802 A1, Daeschlein, C., et al.
U.S. Appl. No. 16/307,191, filed Dec. 5, 2018, US 2019-0144781 A1, Daeschlein, C., et al.
Extended European Search Report dated May 4, 2018 in European Patent Application No. 17199807.3, 3 pages.
Namatsu, H., et al., "Dimensional limitations of silicon nanolines resulting from pattern distortion due to surface tension of rinse water", Applied Physics Letters, vol. 66, Issue 20, May 15, 1995, pp. 2655-2657.

* cited by examiner

*Primary Examiner* — Gregory E Webb
(74) *Attorney, Agent, or Firm* — Armstrong Teasdale LLP

(57) ABSTRACT

The invention relates to the use of a non-aqueous composition comprising an organic solvent and at least one particular siloxane-type additive for treating substrates comprising patterns having line-space dimensions of 50 nm or below and aspect ratios of 4 or more as well as a method for manufacturing integrated circuit devices, optical devices, micromachines and mechanical precision devices, the said method comprising the steps of (1) providing a substrate having patterned material layers having line-space dimensions of 50 nm, aspect ratios of greater or equal 4, or a combination thereof, (2) contacting the substrate at least once with a non-aqueous composition, and (3) removing the non-aqueous composition from the contact with the substrate, wherein the non-aqueous composition comprising an organic solvent and at least one of such siloxane-type additives.

15 Claims, No Drawings

USE OF COMPOSITIONS COMPRISING A SILOXANE-TYPE ADDITIVE FOR AVOIDING PATTERN COLLAPSE WHEN TREATING PATTERNED MATERIALS WITH LINE-SPACE DIMENSIONS OF 50 NM OR BELOW

Use of compositions comprising a siloxane-type additive for avoiding pattern collapse when treating patterned materials with line-space dimensions of 50 nm or below.

The present invention is directed to the use of a composition for manufacturing integrated circuits devices, optical devices, micromachines and mechanical precision devices, in particular to avoid pattern collapse.

BACKGROUND OF THE INVENTION

In the process of manufacturing ICs with LSI, VLSI and ULSI, patterned material layers like patterned photoresist layers, patterned barrier material layers containing or consisting of titanium nitride, tantalum or tantalum nitride, patterned multi-stack material layers containing or consisting of stacks e.g. of alternating polysilicon and silicon dioxide or silicon nitride layers, and patterned dielectric material layers containing or consisting of silicon dioxide or low-k or ultra-low-k dielectric materials are produced by photolithographic techniques. Nowadays, such patterned material layers comprise structures of dimensions even below 22 nm with high aspect ratios.

Irrespective of the exposure techniques the wet chemical processing of small patterns however involves a plurality of problems. As technologies advance and dimension requirements become stricter and stricter, patterns are required to include relatively thin and tall structures or features of device structures i.e., features having a high aspect ratio, on the substrate. These structures may suffer from bending and/or collapsing, in particular, during the spin dry process, due to excessive capillary forces of the liquid or solution of the rinsing liquid deionized water remaining from the chemical rinse and spin dry processes and being disposed between adjacent patterned structures.

In the past, these issues were addressed by reducing) the maximum stress σ between small features caused by the capillary forces according to Namatsu et al. Appl. Phys. Lett. 66(20), 1995:

$$\sigma = \frac{6 \cdot \gamma \cdot \cos\theta}{D} \cdot \left(\frac{H}{W}\right)^2$$

wherein γ is the surface tension of the fluid, θ is the contact angle of the fluid on the feature material surface, D is the distance between the features, H is the height of the features, and W is the width of the features. Therefore, to lower the maximum stress, in the past the approaches focused on lowering the surface tension γ of the fluid, or increasing the contact angle of the fluid on the feature material surface, or both.

Due to the shrinkage of the dimensions, the removal of particles and plasma etch residues in order to achieve a defect free patterned structure becomes also a critical factor. This does apply to photoresist patterns but also to other patterned material layers, which are generated during the manufacture of optical devices, micromachines and mechanical precision devices.

WO 2012/027667 A2 discloses a method of modifying a surface of a high aspect ratio feature by contacting the surface of the high aspect ratio feature with an additive composition to produce a modified surface, wherein forces acting on the high aspect ratio feature when a rinse solution is in contact with the modified surface are sufficiently minimized to prevent bending or collapse of the high aspect ratio feature at least during removal of the rinse solution or at least during drying of the high aspect ratio feature. The modified surface should have a contact angle in a range from about 70 degrees to about 110 degrees. Besides many other types of acids, bases, non-ionic surfactants, anionic surfactants, cationic surfactants, and zwitterionic surfactants, some siloxane-type surfactants are disclosed. A variety of solvents, including water, are described.

WO 2014/091363 A1 discloses a water-based composition comprising a hydrophobizer in combination with a surfactant having a surface tension of 10 mN/m to 35 mN/m, which, besides other types of surfactants, may be a siloxane-type surfactant. The water based composition is preferably free from organic solvents.

However, these compositions still suffer from high pattern collapse in sub 22 nm structures. Especially, without to be bound to any theory, the inventors found that a contact angle in a range from about 70 degrees to about 110 degrees measured with deionized water is not sufficient to describe capillary forces in a solvent based system during drying since the theoretical correlation by Namatsu is only valid in the same solvent system. Furthermore, equation (1) describes only the capillary forces during drying, neglecting potential chemical reactions between collapsing/bending structures during drying and the elastic retraction forces of collapsed structures. Therefore, the inventors believe that pattern collapse can also be prevented by preventing irreversible adhesion between collapsed structures.

It is an object of the present invention to provide a method for manufacturing integrated circuits for nodes of 50 nm and lower, in particular for nodes of 32 nm and lower and, especially, for nodes of 22 nm and lower, which method no longer exhibits the disadvantages of prior art manufacturing methods.

In particular, the compounds according to the present invention shall allow for the chemical rinse of patterned material layers comprising patterns with a high aspect ratio and line-space dimensions of 50 nm and less, in particular, of 32 nm and less, especially, of 22 nm and less, without causing pattern collapse,

SUMMARY OF THE INVENTION

Without being bound to any theory, the invention is based on the finding that focussing on a low surface tension γ of the fluid and a high contact angle θ of the fluid on the feature material surface is an approach which does not work when being faced with feature, which are shirking more and more.

While the prior art focuses on surfactants showing a high contact angle in water, the inventors now found that the contact angle in water has no or little influence on the ability of a surfactant to reduce pattern collapse. Even to the contrary, the inventors found that the composition should be non-aqueous to show an increased anti pattern collapse performance.

The present invention completely avoids, all the disadvantages of the prior art by using a non-aqueous composition comprising an organic solvent in combination with a siloxane-type non-ionic additive as described herein.

A first embodiment of the present invention is the use of a non-aqueous composition comprising an organic solvent and at least one additive of formulae I to IV

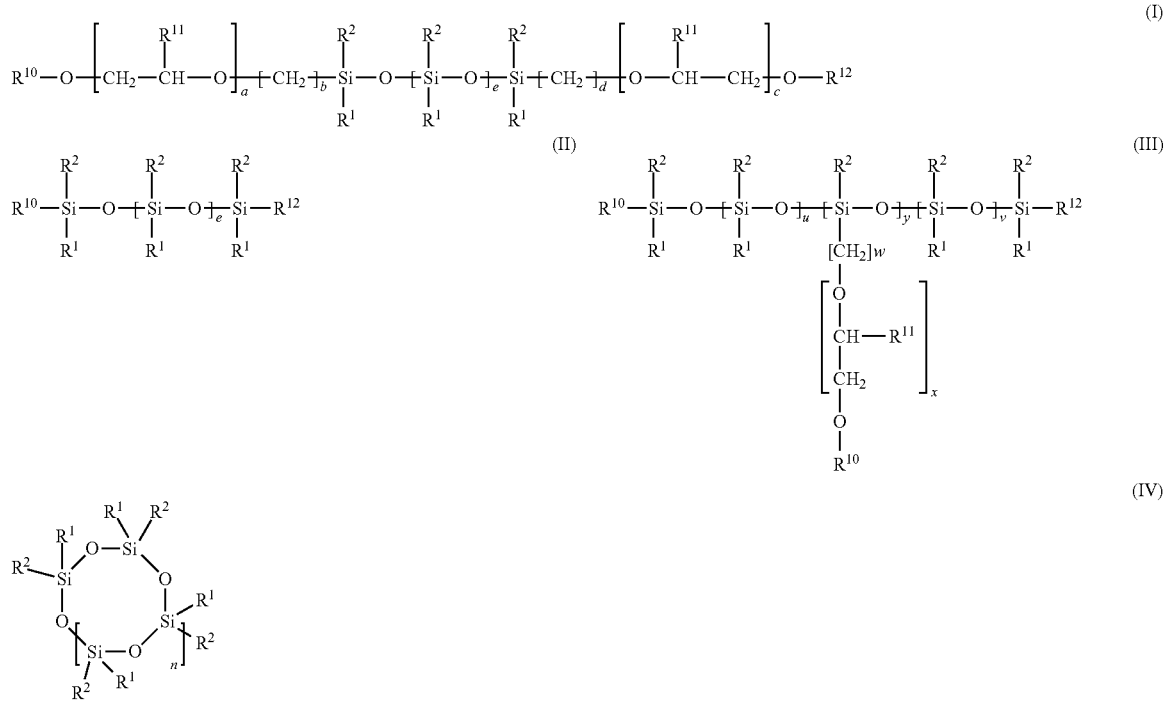

for treating substrates comprising patterns having line-space dimensions of 50 nm or below and aspect ratios of 4 and more, wherein
$R^1$, $R^2$ are independently selected from H or a $C_1$ to $C_{10}$ alkyl group,
n is 0, 1 or 2,
e, u, v are integers independently selected from 0 to 5,
b, d, w are integers independently from 0 to 6,
a, c, x are integers independently selected from 1 to 22,
y are integers from 1 to 5,
$R^{10}$, $R^{12}$ are independently is selected from H or a $C_1$ to $C_{10}$ alkyl group, and
$R^{11}$ is selected from H or a $C_1$ to $C_{10}$ alkyl group.

Another embodiment of the present invention is a method for manufacturing integrated circuit devices, optical devices, micromachines and mechanical precision devices, the said method comprising the steps of
(1) providing a substrate having patterned material layers having line-space dimensions of 50 nm and less, aspect ratios of greater or equal 4, or a combination thereof,
(2) contacting the substrate at least once with a non-aqueous composition as defined in anyone of the preceding claims, and
(3) removing the non-aqueous composition from the contact with the substrate.

The use of an organic solvent, preferably a polar protic organic solvent, in combination and a siloxane-type non-ionic additive is particularly useful for patterned developed photoresist layers comprising patterns having line-space dimensions of 50 nm or less, particularly of 32 nm or less and, most particularly 22 nm or less.

Furthermore, the use of a non-aqueous composition comprising an organic solvent in combination and a siloxane-type non-ionic additive according to the invention is particularly useful for aspect ratios greater or equal 4 without causing pattern collapse.

It has to be noted that the cleaning solutions comprising an organic solvent in combination with a siloxane-type non-ionic additive according to the present invention are generally useful for avoiding pattern collapse of photoresist structures as well as of non-photoresist patterns with high aspect ratios stacks (HARS), particularly patterned multi-stack material layers containing or consisting of stacks comprising alternating polysilicon and silicon dioxide or silicon nitride layers.

DETAILED DESCRIPTION OF THE INVENTION

The present invention is directed to a composition particularly suitable for manufacturing patterned materials comprising sub 50 nm sized features like integrated circuit (IC) devices, optical devices, micromachines and mechanical precision devices, in particular IC devices.

Any customary and known substrates used for manufacturing IC devices, optical devices, micromachines and mechanical precision devices can be used in the process of the invention. Preferably, the substrate is a semiconductor substrate, more preferably a silicon wafer, which wafers are customarily used for manufacturing IC devices, in particular IC devices comprising ICs having LSI, VLSI and ULSI.

The composition is particularly suitable for treating substrates having patterned material layers having line-space dimensions of 50 nm and less, in particular, 32 nm and less and, especially, 22 nm and less, i.e. patterned material layers for the sub-22 nm technology nodes. The patterned material layers preferably have aspect ratios above 4, preferably above 5, more preferably above 6, even more preferably above 8, even more preferably above 10, even more preferably above 12, even more preferably above 15, even more preferably above 20. The smaller the line-space dimensions and the higher the aspect ratios are the more advantageous is the use of the composition described herein.

The composition according to the present invention may be applied to substrates of any patterned material as long as structures tend to collapse due to their geometry.

By way of example, the patterned material layers may be (a) patterned silicon oxide or silicon nitride coated Si layers, (b) patterned barrier material layers containing or consisting of ruthenium, cobalt, titanium nitride, tantalum or tantalum nitride,
(c) patterned multi-stack material layers containing or consisting of layers of at least two different materials selected from the group consisting of silicon, polysilicon, silicon dioxide, low-k and ultra-low-k materials, high-k materials, semiconductors other than silicon and polysilicon, and metals, and
d) patterned dielectric material layers containing or consisting of silicon dioxide or low-k or ultra-low-k dielectric materials.

Organic Solvent

The anti-pattern-collapse composition comprises an organic solvent, preferably a polar protic organic solvent.

Surprisingly it was found that even low amounts of water may influence the performance of the anti-pattern-collapse capability of the subject compositions. It is therefore important that the compositions, essentially the organic solvent(s) present in the compositions according to the present invention are non-aqueous. Due to its hygroscopicity IPA usually has a rather high amount of residual water unless removed by drying.

As used herein, "non-aqueous" means that the composition may only contain low amounts of water up to about 1% by weight. Preferably the non-aqueous composition comprises less than 0.5% by weight, more preferably less than 0.2% by weight, even more preferably less than 0.1% by weight, even more preferably less than 0.05% by weight, even more preferably less than 0.02% by weight, even more preferably less than 0.01% by weight, even more preferably less than 0.001% by weight of water. Most preferably essentially no water is present in the composition. "Essentially" here means that the water present in the composition does not have a significant influence on the performance of the additive in the non-aqueous solution with respect to pattern collapse of the substrates to be treated.

The organic solvents need to have a boiling point sufficiently low to be removed by heating without negatively impacting the substrate treated with the composition. For typical substrates, the boiling point of the organic solvent should be 150° C. or below, preferably 100° C. or below.

It is preferred that the solvent essentially consists of one or more organic solvents, which may be protic or aprotic organic solvents. Preferred are one or more polar protic organic solvents, most preferred a single polar protic organic solvent.

As used herein a "polar aprotic organic solvent" is an organic solvent which has no acidic hydrogen (i.e. that does not contain or cannot donate a hydrogen ion), has a dipole moment of 1.7 or more.

Typical Polar aprotic organic solvents are (a), without limitation, ketones, such as but not limited to acetone, (b) lactones, such as but not limited to γ-butyrolactone, (c) lactames, such as but not limited to N-methyl-2-pyrrolidone, (d) nitriles, such as but not limited to acetonitrile, (e) nitro compounds, such as but not limited to nitromethane, (f) tertiary carboxylic acid amides, such as but not limited to dimethylformamide, (g) urea derivates, such as but not limited to tetramethyl urea or dimethylpropylene urea (DMPU), (h) sulfoxides, such as but not limited to dimethylsulfoxid (DMSO), (i) sulfone, such as but not limited to sulfolane, (h) carbonic acid esters, such as but not limited to dimethylcarbonate or ethylencarbonate.

As used herein a "polar protic organic solvent" is an organic solvent which comprises an acidic hydrogen (i.e. that can donate a hydrogen ion).

Typical polar protic organic solvents are, without limitation, (a) alcohols, such as but not limited to methanol, ethanol, 1-propanol, 2-propanol (isopropanol) or butanols, (b) primary or secondary amines, carboxylic acids, such as but not limited to formic acid or acetic acid, or (c) primary or secondary amides, such as but not limited to formamide.

Preferred organic solvents are linear, branched or cyclic aliphatic alcohols, particularly linear or branched alkanols, which comprise at least one hydroxy group. Preferred alkanols are methanol, ethanol, n-propanol, isopropanol and butanol. Most preferred is isopropanol.

Additives of Formula I

In one embodiment of the present invention the non-ionic additive according to the present invention (also referred to as additive or siloxane) may be selected from formula I:

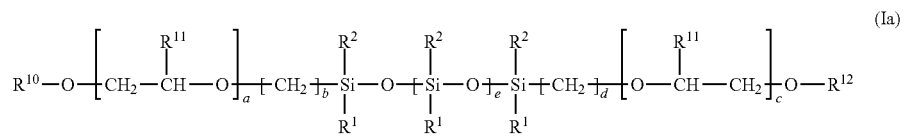

(Ia)

wherein
$R^1$, $R^2$ are independently selected from H or a $C_1$ to $C_{10}$ alkyl group, preferably H, methyl, propyl or butyl, most preferably methyl,
e is an integer selected from 0 to 5, preferably 0, 1 or 2, most preferably 0 or 1,
b, d are integers independently from 0 to 6, preferably 0 or 1 to 3, most preferably 0, 1 or 2,
a, c are integers independently selected from 1 to 22, preferably from 3 to 20, most preferably from 5 to 15,
$R^{10}$, $R^{12}$ are independently selected from H or a $C_1$ to $C_{10}$ alkyl group, preferably H, methyl, ethyl, propyl or butyl, most preferably methyl, and
$R^{11}$ is selected from H or a $C_1$ to $C_3$ alkyl group, preferably H, methyl or ethyl, most preferably H or methyl.

In a preferred embodiment, the siloxanes of formula I are used in, wherein
$R^1$, $R^2$ are independently selected from H, methyl or ethyl, preferably methyl,
e is 0, 1 or 2, preferably 1,
b, d are 0, 1 or 2, preferably 0 or 1,
a, c are integers independently selected from 0 to 10, preferably from 0 to 4,
$R^{10}$, $R^{12}$ are independently selected from H, methyl or ethyl, preferably methyl, and
$R^{11}$ is selected from methyl or ethyl, preferably methyl.

Additives of Formula II

In one embodiment of the present invention the non-ionic additive according to the present invention (also referred to as additive or siloxane) may be selected from formula II, which covers the so called trisiloxane type and rake type siloxane additives:

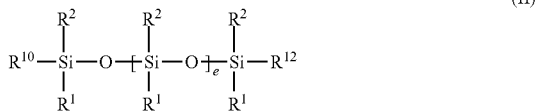

(II)

wherein
$R^1$, $R^2$ are independently selected from H or a $C_1$ to $C_{10}$ alkyl group, preferably H, methyl, ethyl, propyl or butyl, most preferably methyl or ethyl,
e, is an integer from 0 to 5, preferably 0, 1 or 2, most preferably 1,
$R^{10}$, $R^{12}$ are independently selected from H or a $C_1$ to $C_{10}$ alkyl group, preferably H, methyl, propyl or butyl, most preferably methyl or ethyl.

In a preferred embodiment, the siloxanes of formula II are used, wherein
$R^1$, $R^2$ are methyl,
e is 0, 1 or 2, preferably 1,
$R^{10}$, $R^{12}$ are independently selected from methyl or ethyl, preferably methyl.

Additives of Formula III

In another embodiment of the present invention the non-ionic additive according to the present invention (also referred to as additive) may be selected from formula III, which covers the so-called ABA-type siloxane additives:

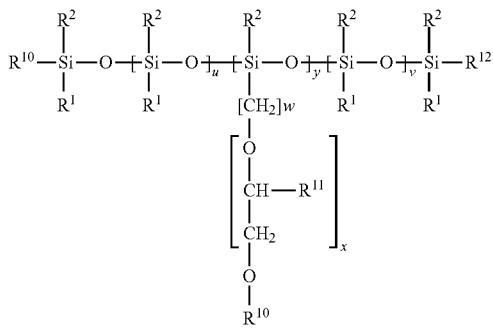

(III)

wherein
$R^1$, $R^2$ are independently selected from H or a $C_1$ to $C_{10}$ alkyl group, preferably H, methyl, ethyl, propyl or butyl, most preferably methyl or ethyl,
u, v are integers independently selected from 0 to 5, preferably 0, 1, 2 or 3, most preferably 0 or 1,
w is an integer from 0 to 6, preferably 0 or 1 to 3, most preferably 0, 1 or 2,
x is an integer from 1 to 22, preferably from 2 to 20, most preferably from 5 to 15,
y is an integer from 1 to 5, preferably 1 or 2, most preferably 1,
$R^{10}$, $R^{12}$ are independently selected from H or a $C_1$ to $C_{10}$ alkyl group, preferably H, methyl, ethyl, propyl or butyl, most preferably methyl or ethyl, and
$R^{11}$ is selected from H, methyl or ethyl, preferably H or methyl, most preferably H.

In a preferred embodiment, the siloxanes of formula III are those in which
$R^1$, $R^2$ are methyl or ethyl, preferably methyl,
u, v are 0 or 1, preferably 0,
w is 0 or 3, preferably 3,
x is an integer from 2 to 20, preferably from 5 to 15,
y is 1 or 2, preferably 1,
$R^{10}$, $R^{12}$ are independently selected from methyl or ethyl, preferably methyl, and
$R^{11}$ is selected from H or methyl, preferably H.

Additives of Formula IV

In another embodiment of the present invention the non-ionic additive according to the present invention (also referred to as additive) may be selected from formula IV:

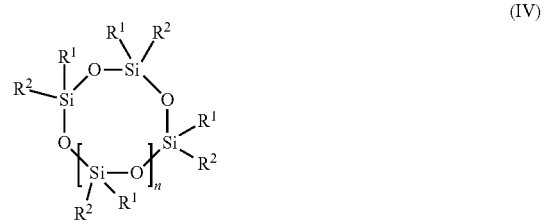

(IV)

wherein
$R^1$, $R^2$ are independently selected from H or a $C_1$ to $C_{10}$ alkyl group, preferably methyl, ethyl, propyl or butyl, most preferably methyl or ethyl and
n is 0, 1 or 2, preferably 0 or 1, most preferably 1.

In a preferred embodiment, the at least one additive is a cyclic siloxane of formula IV, wherein
n is 1, and
$R^1$, $R^2$ are the same or different and selected from methyl ethyl, propyl or butyl.

The siloxane compounds of formula I to IV are available in the market e.g. under the trade names Silwet™ and Tegopren™.

The concentration of the additives of formulae I, II, III and IV in the non-aqueous solution may generally be in the range of about 0.00005 to about 3% by weight. Preferably the concentration of the additive if from about 0.00005 to about 1.0% by weight, more preferably from about 0.0005 to about 0.5% by weight, even more preferably from 0.0005 to 0.1% by weight, even more preferably from 0.001 to 0.1% by weight, and most preferably 0.002 to 0.1% by weight, the weight percentages being based on the overall weight of the composition.

There may be one or more additives in the composition, however it is preferred to use only one additive of formula I, II, III or IV. Preferably, the non-aqueous composition does only consist of ultra pure water and one additive of formula I, II, III or IV.

Most preferably the composition consists of a single organic solvent and a single additive of formula I, II, III or IV.

Nevertheless, further additive may be present in the cleaning solution according to the present invention. Such additives may be
(I) buffer components for pH adjustment such as but not limited to $(NH_4)_2CO_3/NH_4OH$, $Na_2CO_3/NaHCO_3$, tris-hydroxymethyl-aminomethane/HCl, $Na_2HPO_4/NaH_2PO_4$, or organic acids like acetic acid etc., methanesulfonic acid,
(II) one or more further additives, either non-ionic, or, anionic to improve surface tension and solubility of the mixture, or
(III) dispersants to prevent the surface re-attachment of the removed particles of dirt or polymer.

In accordance with the method of the invention, the non-aqueous solution comprising the two different types of additives may be used for different purposes and objects. Thus, it may be used as an immersion liquid for immersing photoresists during irradiation with actinic light through a mask, as a developer solution for photoresist layers exposed to actinic radiation through a mask and as a chemical rinse solution for rinsing the patterned material layers.

In one embodiment, the method for manufacturing integrated circuit devices, optical devices, micromachines and mechanical precision devices has been found, the method comprising the steps of
(1) providing a substrate having patterned material layers having line-space dimensions of 50 nm and less and aspect ratios of greater or equal 4,
(2) contacting the substrate at least once with a non-aqueous, solution containing at least a siloxane additive as described herein, and
(3) removing the aqueous solution from the contact with the substrate.

In the third step of the method according to the invention, the non-aqueous solution is removed from the contact with the substrate. Any known methods customarily used for removing liquids from solid surfaces can be employed.

Preferably the substrate is provided by a photolithographic process comprising the steps of
(i) providing the substrate with an immersion photoresist, EUV photoresist or eBeam photoresist layer,
(ii) exposing the photoresist layer to actinic radiation through a mask with or without an immersion liquid,
(iii) developing the exposed photoresist layer with a developer solution to obtain a pattern having line-space dimensions of 32 nm and less and an aspect ratio of 10 or more,
(iv) applying the non-aqueous composition described herein to the developed patterned photoresist layer, and
(v) spin drying the semiconductor substrate after the application of the non-aqueous composition.

Any customary and known immersion photoresist, EUV photoresist or eBeam photoresist can be used. The immersion photoresist may already contain at least one of the siloxane additives or a combination thereof. Additionally, the immersion photoresist may contain other nonionic additives. Suitable nonionic additives are described, for example, in US 2008/0299487 A1, page 6, paragraph [0078]. Most preferably, the immersion photoresist is a positive resist.

Beside e-Beam exposure or extreme ultraviolet radiation of approx. 13.5 nm, preferably, UV radiation of the wavelength of 193 nm is used as the actinic radiation.

In case of immersion lithography preferably, ultra-pure water is used as the immersion liquid.

Any customary and known developer solution can be used for developing the exposed photoresist layer. Preferably, aqueous developer solutions containing tetramethylammonium hydroxide (TMAH) are used.

Preferably, the chemical rinse solutions are applied to the exposed and developed photoresist layers as puddles.

It is essential for photolithographic process according to the method of the invention, that the chemical rinse solution contains at least one of the siloxane additives.

Customary and known equipment customarily used in the semiconductor industry can be used for carrying out the photolithographic process in accordance with the method of the invention.

EXAMPLES

Example 1

Patterned silicon wafers with a circular nano pillar pattern were used to determine the pattern collapse performance of the formulations during drying. The (aspect ratio) AR 20 pillars used for testing have a height of 600 nm and a diameter of 30 nm. The pitch size is 90 nm. 1×1 cm wafer pieces where processed in the following sequence without drying in between:

30 s Dilute Hydrofluoric Acid (DHF) 0.5% dip, 60 s ultra-pure water (UPW) dip, 60 s isopropanol (IPA) dip, 60 s dip of a solution of the respective siloxane additive in isopropanol at room temperature, 60 s IPA dip, $N_2$ blow dry.

The dried silicon wafers where analyzed with top down SEM and the collapse statistics for examples S1-S4 are shown in table 1.

The following additives were used in the examples:

1:

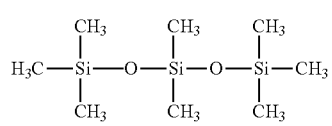

2:

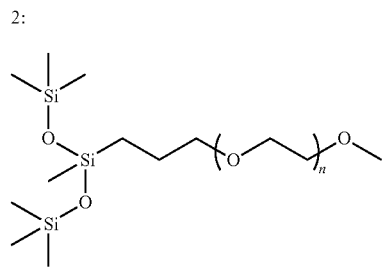

with n=13-15

3: $^{MeO}Me_2SiOSiMe_2^{OMe}$

4:

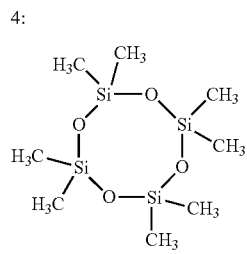

5: $^{EtO}Me_2SiO(Me_2SiO)_{8.3}SiMe_2^{OEt}$

The dried silicon wafers where analyzed with top down SEM.

The pattern collapse Cluster Size Distribution was determined from the SEM images. The cluster size corresponds to number of uncollapsed pillars the respective cluster consist of. By way of example, if the wafer before treatment comprises 4×4 pillars and 8 remain uncollapsed, 4 collapse into two clusters comprising 2 pillars and 4 pillars collapse into one cluster comprising 4 pillars the ratio would be 8/11 single clusters, 2/11 double clusters and 1/11 clusters with four pillars.

TABLE 1

| Example | Additive | Solvent (water content wt %) | Cluster Size Distribution in collapsed structures [%] | | | |
|---|---|---|---|---|---|---|
| | | | 1 | 2 | 3 or 4 | >5 |
| 1 (comp.) | none | <0.01 | 36 | 19 | 44 | 1 |
| 3 | 1 | <0.01 | 49 | 20 | 30 | 1 |
| 4 | 2 | <0.01 | 62 | 20 | 18 | 0 |
| 5 | 3 | <0.01 | 52 | 23 | 25 | 0 |
| 6 | 4 | <0.01 | 58 | 22 | 20 | 0 |
| 7 | 5 | <0.01 | 44 | 18 | 37 | 1 |

Table 1 shows that additives 1 to 4 have a beneficial effect on the degree of pattern collapse compared to the solution without any additive.

Example 2

In order to determine the effect of water in the organic solvent, patterned silicon wafers with a circular nano pillar pattern were used to determine the pattern collapse performance of the formulations during drying. The (aspect ratio) AR 22 pillars used for testing had a height of 550 nm and a diameter of 25 nm. The pitch size was 90 nm. 1×1 cm wafer pieces where processed in the following sequence without drying in between:
  30 s dilute hydrofluoric acid (DHF) 0.5% dip,
  60 s ultra-pure water (UPW) dip,
  60 s isopropanol (IPA) dip,
  60 s dip of a solution of the respective siloxane additive in isopropanol at room temperature,
  60 s IPA dip,
  N$_2$ blow dry.

The dried silicon wafers where analyzed with top down SEM. The pattern collapse Cluster Size Distribution was determined from the SEM images as describe above.
The results are shown in table 2.

TABLE 2

| Example | Additive | Solvent (water content wt %) | Ratio of pillars in collapsed structures [%] | | | |
|---|---|---|---|---|---|---|
| | | | 1 | 2 | 3 or 4 | >5 |
| 1 (comp.) | none | <0.01 | 8 | 9 | 69 | 14 |
| 2 (comp.) | none | 1 | 12 | 19 | 35 | 34 |

Table 2 shows that a low amount of water below 0.01% leads to a lower degree of collapsed pillars compared to a water content of 1%.

The invention claimed is:

1. A method, comprising:
contacting at least one substrate with a non-aqueous composition comprising an organic solvent and at least one additive of formulae I to IV:

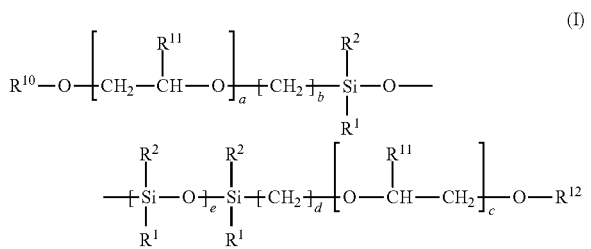

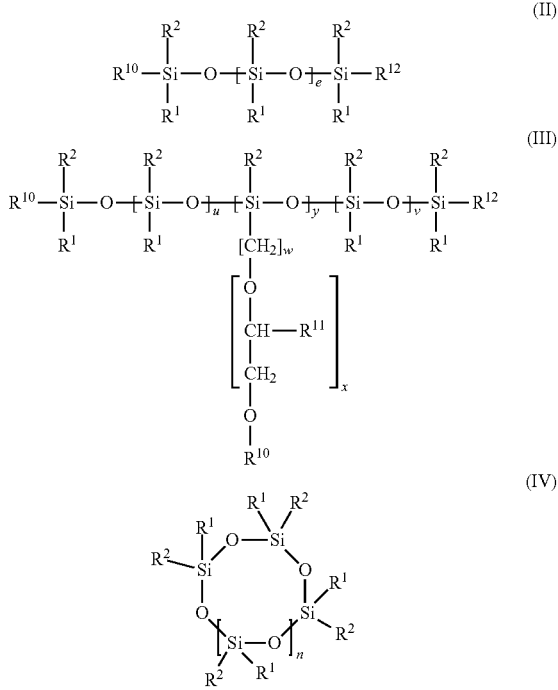

wherein
R$^1$ and R$^2$ are independently selected from H or a C$_1$ to C$_{10}$ alkyl group,
n is 0, 1 or 2,
e, u and v are integers independently selected from 0 to 5,
b, d and w are integers independently from 0 to 6,
a, c and x are integers independently selected from 1 to 22,
y is an integer from 1 to 5,
R$^{10}$ and R$^{12}$ are independently selected from H or a C$_1$ to C$_{10}$ alkyl group, and
R$^{11}$ is, for each a, c and x independently, selected from H, methyl and ethyl,
wherein the at least one additive of formulae I, II, III or IV is present in a concentration from about 0.00005% to about 1.0% by weight, based on an overall weight of the non-aqueous composition, and
wherein the at least one substrate comprises patterns having line-space dimensions of 50 nm or below and aspect ratios of 4 or more.

2. The method according to claim 1, wherein the organic solvent is a polar protic organic solvent.

3. The method according to claim 1, wherein the organic solvent is a linear or branched C$_1$ to C$_{10}$ alkanol.

4. The method according to claim 3, wherein the organic solvent is isopropanol.

5. The method according to claim 1, wherein a content of water in the non-aqueous composition is lower than 0.1% by weight.

6. The method according to claim 1, wherein the non-aqueous composition consists essentially of the organic solvent and the at least one additive of formula I, II, III or IV.

7. The method according to claim 1, wherein the at least one additive of formula I, II, III or IV is present in a concentration from 0.001 to 0.1% by weight.

8. The method according to claim 1, wherein the at least one additive is a compound of formula I, wherein
R$^1$ and R$^2$ are independently selected from H, methyl or ethyl,
e is 0, 1 or 2,
b and d are 0, 1 or 2,
a and c are integers independently selected from 1 to 22,
R$^{10}$ and R$^{12}$ are independently selected from H, methyl or ethyl, and
R$^{11}$ is selected from methyl or ethyl.

9. The method according to claim 1, wherein the at least one additive is a compound of formula II,
wherein
R$^1$ and R$^2$ are methyl,
e is 0, 1 or 2, and
R$^{10}$ and R$^{12}$ are independently selected from methyl or ethyl.

10. The method according to claim 1, wherein the at least one additive is a compound of formula III,
wherein
R$^1$ and R$^2$ are methyl or ethyl,
u and v are 0 or 1,
w is 0 or 3,
x is an integer from 2 to 25,
y is 1 or 2,
R$^{10}$ and R$^{12}$ are independently selected from methyl or ethyl, and
R$^{11}$ is selected from H or methyl.

11. The method according to claim 1, wherein the at least one additive is a compound of formula IV,
wherein
n is 1, and
R$^1$ and R$^2$ are independently selected from methyl ethyl, propyl and butyl.

12. A method for manufacturing an integrated circuit device, an optical device, an micromachine and an mechanical precision device, the method comprising:
(1) providing a substrate having patterned material layers having line-space dimensions of 50 nm, aspect ratios of greater or equal 4, or a combination thereof,
(2) contacting the substrate at least once with a non-aqueous composition, and
(3) removing the non-aqueous composition with the substrate,
wherein the non-aqueous composition comprises an organic solvent and at least one additive of formulae I to IV $$R^{10}-O-\left[CH_2-\underset{R^{11}}{CH}-O\right]_a-\left[CH_2\right]_b-\underset{R^1}{\overset{R^2}{Si}}-O-\left[\underset{R^1}{\overset{R^2}{Si}}-O\right]_e-\underset{R^1}{\overset{R^2}{Si}}-\left[CH_2\right]_d-\left[O-\underset{R^{11}}{CH}-CH_2\right]_c-O-R^{12} \quad (I)$$

$$R^{10}-\underset{R^1}{\overset{R^2}{Si}}-O-\left[\underset{R^1}{\overset{R^2}{Si}}-O\right]_e-\underset{R^1}{\overset{R^2}{Si}}-R^{12} \quad (II)$$

$$R^{10}-\underset{R^1}{\overset{R^2}{Si}}-O-\left[\underset{R^1}{\overset{R^2}{Si}}-O\right]_u-\left[\underset{[CH_2]_w}{\overset{R^2}{Si}}-O\right]_y-\left[\underset{R^1}{\overset{R^2}{Si}}-O\right]_v-\underset{R^1}{\overset{R^2}{Si}}-R^{12} \quad (III)$$

with pendant group:
$$\left[\begin{array}{c} O \\ | \\ CH-R^{11} \\ | \\ CH_2 \\ | \\ O \\ | \\ R^{10} \end{array}\right]_x$$

(IV) cyclic siloxane structure with R$^1$, R$^2$ substituents and subscript n wherein
R$^1$ and R$^2$ are independently selected from H or a C$_1$ to C$_{10}$ alkyl group,
n is 0, 1 or 2,
e, u and v are integers independently selected from 0 to 5,
b, d and w are integers independently from 0 to 6,
a, c and x are integers independently selected from 1 to 22,
y is an integer from 1 to 5,
R$^{10}$ and R$^{12}$ are independently selected from H or a C$_1$ to C$_{10}$ alkyl group, and
R$^{11}$ is, for each a, c and x independently, selected from H, methyl and ethyl, and wherein the at least one additive of formulae I, II, III or IV is present in a concentration from about 0.0000.5% to about 1.0% by weight based on an overall weight of the composition.

13. The method according to claim 12, wherein the patterned material layers have line-space dimensions of 32 nm and less and aspect ratios of 10 or more.

14. The method according to claim 12, wherein the patterned material layers are selected from the group consisting of patterned developed photoresist layers, patterned barrier material layers, patterned multi-stack material layers and pattern dielectric material layers.

15. The method according to claim 12, wherein the substrate is provided by a photolithographic process comprising:
   (i) providing the substrate with an immersion photoresist, EUV photoresist or eBeam photoresist layer,
   (ii) exposing the photoresist layer to actinic radiation through a mask with or without an immersion liquid,
   (iii) developing the exposed photoresist layer with a developer solution to obtain a pattern having line-space dimensions of 50 nm and less and an aspect ratio of 4 or more,
   (iv) applying the non-aqueous composition to the developed patterned photoresist layer, and
   (v) spin drying the semiconductor substrate after the application of the non-aqueous composition.

* * * * *